United States Patent [19]

Takeuchi

[11] Patent Number: 4,743,841
[45] Date of Patent: May 10, 1988

[54] SEMICONDUCTOR INTEGRATED CIRCUIT INCLUDING CIRCUIT ELEMENTS EVALUATING THE SAME AND HAVING MEANS FOR TESTING THE CIRCUIT ELEMENTS

[75] Inventor: Atsushi Takeuchi, Kawasaki, Japan

[73] Assignee: Fujitsu Limited, Kanagawa, Japan

[21] Appl. No.: 863,900

[22] Filed: May 16, 1986

[30] Foreign Application Priority Data

May 20, 1985 [JP] Japan .................................. 60-107827

[51] Int. Cl.⁴ .............................................. G01R 31/28
[52] U.S. Cl. ................................. 324/73 R; 324/158 R
[58] Field of Search ............ 324/73 R, 73 PC, 158 R; 371/20, 25, 15

[56] References Cited

U.S. PATENT DOCUMENTS

| | | | |
|---|---|---|---|
| 4,243,937 | 1/1981 | Multani et al. | 324/73 PC |
| 4,336,495 | 6/1982 | Hapke, I | 324/73 R |
| 4,339,710 | 7/1982 | Hapke, II | 324/73 R |
| 4,398,146 | 8/1983 | Draheim et al. | 324/73 R |

Primary Examiner—Ernest F. Karlsen
Attorney, Agent, or Firm—Armstrong, Nikaido, Marmelstein & Kubovcik

[57] ABSTRACT

A semiconductor integrated circuit including at lease one circuit (6, 8, 9, 71, 72, 104 to 106, 118, 119), at least one evaluating circuit element (10, 11, 12), a plurality of bonding pads (31 to 39) operatively connectable to the circuit and the evaluating circuit element, and a circuit for selectively connecting between the circuit and the bonding pads and between the evaluating circuit element and the bonding pads operatively connectable to the circuit. The selectively connecting circuit includes switching circuits (41 to 49) provided between the bonding pads and the evaluating circuit element and switching the connection between the bonding pads and the evaluating circuit element in response to a control signal. The semiconductor intergrated circuit may further include a circuit ($Q_{11}$, $Q_{12}$, 25, 58, 59) for controlling the at least one circuit to have a high impedance as seen from the bonding pads, in response to the control signal. The selectively connecting circuit may further include a circuit (2, 2') for outputting the control signal in response to reception of a test request signal.

7 Claims, 4 Drawing Sheets

SEMICONDUCTOR INTEGRATED CIRCUIT INCLUDING CIRCUIT ELEMENTS EVALUATING THE SAME AND HAVING MEANS FOR TESTING THE CIRCUIT ELEMENTS

BACKGROUND OF THE INVENTION (1) Field of the Invention

The present invention relates to a semiconductor integrated circuit (IC). More particularly, it relates to a semiconductor IC including circuit elements for evaluating the characteristics of the ICs and having means for testing the evaluating circuit elements.

(2) Description of the Related Art

Semiconductor ICs are tested in several steps, such as after completion of the processes of forming ICs in a semiconductor wafer, after cutting IC chips away from the wafer, and after packaging the IC device. In the test after completion of the processes of forming the ICs in the wafer, in order to determine whether the wafer or the ICs in the wafer are usable or not, the characteristics of fundamental and typical circuit elements in the wafer, such as a resistor and a transistor, are tested and evaluated. Typical fundamental circuits, such as a flip-flop, an AND gate, also may be tested and evaluated. Normal circuits formed in each IC chip may be tested through bonding pads provided in each IC chip with a test facility (IC tester). However, the fundamental circuit elements cannot be directly tested because they have been already mutually-connected in the wafer to form desired ICs, and accordingly almost none of the terminals thereof appear on the surface of the wafer, and other terminals appearing on the surface are too small to allow direct contact with a test probe thereon.

Then, additional fundamental circuit elements, i.e., so-called monitor elements for testing and evaluating the characteristics of the wafer or the ICs in the wafer, are formed in a spare portion(s) of the wafer, in each IC chip, or as a special IC chip. The additional fundamental circuit elements are formed by the same processes used for the formation of the normal circuits, and accordingly, are regarded as circuit elements having the same characteristics as circuit elements in the normal circuits, and thus, the characteristics of the circuit elements in the normal circuits may be evaluated by testing and evaluating the additional circuit elements. When the additional circuit elements are formed in the spare portion of the wafer, although this may be beneficial for integration, an evaluation cannot be made of the validity of each IC chip and a test of the characteristic cannot be carried out after the IC chips are cut away from the wafer or after packaging. When the additional circuit elements are formed in each IC chip, it contributes to an improvement of the yield of the IC chips, because the evaluation and determination of the use may be effected for each IC chip.

The above problem of placing the test probe in contact with the terminals still remains unless the additional circuit elements are formed. When the additional circuit elements are formed in the spare portion in the wafer or as the special IC chip, bonding pads may be also formed around the additional circuit elements in a same way as for forming normal bonding pads, and thus these methods will easily solve the above problem. However, the former method involves the problems of a limitation of the validity of each IC chip and a limitation of the test after cutting the IC chips, as set forth above. The latter method also involves a problem of low availability of the IC chips in the wafer in addition to the above problems. When the additional circuit elements are formed in each IC chip, the problem in question may be greatly increased, because the size of the bonding pad necessitates the use of a considerably large area, for example, approximately several tens of micron-meters ($\mu$m) = × several tens of micron-meters to approximately 100 $\mu$m = 100 $\mu$m, to enable contact to be made by the test probe. Therefore, apparently, additional bonding pads each having a same size as the normal bonding pad cannot be actually provided, due to the restriction of the integration of the IC chip. The test of the additional circuit elements may be realized by using spare normal bonding pads which are not used for the normal circuits. However, in general, there are not enough spare normal bonding pads to allow testing of all of the additional circuit elements. Even if special bonding pads each having a considerably smaller area than that of the normal bonding pad are provided in each IC chip, a special test facility including a specially shaped test probe may be required. Moreover, the limitation of the tests after packaging the IC, etc., will still remain.

SUMMARY OF THE INVENTION

An object of the present invention is to provide a semiconductor integrated circuit (IC) including circuit element(s) and/or circuit(s) for evaluating the characteristics of the semiconductor IC and having a small size means for testing the above evaluating circuit element(s) and/or the evaluating circuit(s).

Another object of the present invention is to provide a semiconductor IC including the above evaluating circuit element(s) and/or the evaluating circuits and having means for testing the same by an easy operation.

Still another object of the present invention is to provide a semiconductor IC including the above evaluating circuit element(s) and/or the evaluating circuit(s) and having means for testing the same, applicable throughout all steps of testing the semiconductor IC.

According to the present invention, there is provided a semiconductor integrated circuit including: at least one circuit; at least one evaluating circuit element; a plurality of bonding pads operatively connectable to the circuit and the evaluating circuit elements; and a circuit for selectively connecting either between the circuit and the bonding pads or between the evaluating circuit element and the bonding pads operatively connectable to the circuit. The selectively connecting circuit includes switching circuits provided between the bonding pads and the evaluating circuit element and switching the connection between the bonding pads and the evaluating circuit element in response to a control signal, and circuits for giving the circuit to the bonding pads connected to the evaluating circuit a high impedance in response to the control signal. The selectively connecting circuit may further include a circuit for outputting the control signal in response to reception of a test request signal.

BRIEF DESCRIPTION OF THE DRAWINGS

Other objects and features of the present invention will be described below in detail with reference to the accompanying drawings, in which.

DESCRIPTION OF THE PREFERRED EMBODIMENTS

Figure 1:
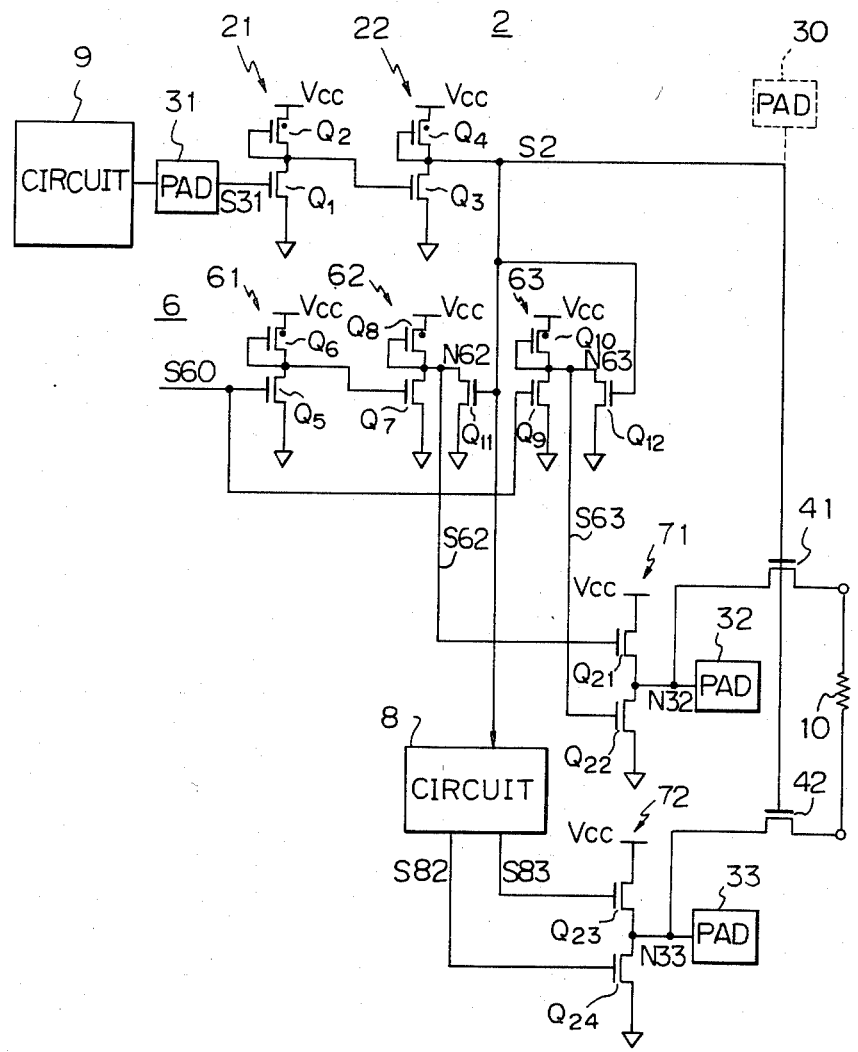
FIG. 1 is a circuit diagram of an embodiment of the semiconductor IC including an additional circuit element for evaluating the IC and means for testing the same, in accordance with the present invention.

Referring to FIG. 1, a metal oxide semiconductor (MOS) type integrated circuit (IC) chip in a semiconductor wafer includes normal circuits 6, 8 and 9, n-channel MOS(N-MOS) output drivers 71 and 72, and bonding pads 31, 32, and 33. These circuit components are used for normal purposes. A part of the normal circuit 6 is illustrated in FIG. 1 and includes a first MOS inverter 61 consisting of depletion-type MOS transistor (hereinafter called D-transistor) $Q_6$ functioning as a resistor and an enhancement-type MOS transistor (hereinafter called E-transistor) $Q_5$, a second MOS inverter 62 of a D-transistor $Q_8$ and an E-transistor $Q_7$, and a third MOS inverter 63 of a D-transistor $Q_{10}$ and an E-transistor $Q_9$. A node N62 of the second inverter 62 is connected to a gate of a transistor $Q_{21}$. A node N63 of the third inverter 63 is connected to a gate of a transistor $Q_{22}$. The series-connected transistors $Q_{21}$ and $Q_{22}$ form the N-MOS output driver 71.

In FIG. 1, the MOS-IC chip further includes a resistor 10 as one circuit element for evaluating the characteristics of the ICs in the MOS-IC chip, and a means for testing the resistor 10. The test means includes a control circuit 2, transfer gate MOS transistors 41 and 42, MOS transistors $Q_{11}$ and $Q_{12}$, and the bonding pads 31 to 33. The control circuit 2 includes a first MOS inverter 21 consisting of a D-transistor $Q_2$ and an E-transistor $Q_1$, and a second MOS inverter 22 consisting of a D-transistor $Q_4$ and an E-transistor $Q_3$. The normal circuit 9 connected to the bonding pad 31 may have a MOS input driver which may have a high input-impedance, as will be described later. The input driver in the normal circuit 9 may operate in response to a voltage between $V_{CC}$, for example, 5V, and $V_{EE}$, for example, 0V. The transistor $Q_1$ has a gate which is common-connected to the bonding pad 31, and must not be operated by the above voltage to the input driver. Accordingly, a threshold voltage $V_{th}$ of the transistor $Q_1$ must be higher than the voltage $V_{CC}$. When the voltage of $V_{CC}$ is applied to the bonding pad 31, the control circuit 2 does not operate and a control signal S2 therefrom is maintained at low level. On the other hand, when a voltage higher than the threshold voltage $V_{th}$ of the transistor $Q_1$ is supplied to the bonding pad 31, the transistor $Q_1$ is turned ON, and thus the transistor $Q_3$ is turned OFF, outputting a control signal S2 having a high level. The transfer gate transistors 41 and 42 operatively connect the resistor 10 to the bonding pads 32 and 33, upon receipt the control signal S2 having a high level from the control circuit 2 at gates thereof. The transistor $Q_{11}$ parallel-connected to the transistor $Q_7$ makes a potential at the node N62 to be low level in response to reception of the control signal S2 having a high level at a gate thereof, with a result that the transistor $Q_{21}$ of the output driver 71 is compulsorily turned OFF. Similarly, the transistor $Q_{12}$ parallel-connected to the transistor $Q_9$ also makes a potential at the node N63 to be low level in response to reception of the control signal S2 having a high level at a gate thereof, causing the transistor $Q_{22}$ of the output driver 71 to turn OFF. As a result, the output driver 71 has a high impedance to the bonding pad 32. The circuit 8 also includes output driver high-impedance making transistors similar to the transistors $Q_{11}$ and $Q_{12}$, in addition to inverters similar to the MOS inverters 61 to 63.

The operation of the MOS-IC chip in FIG. 1 will be described.

In a normal operation mode, the voltage between $V_{CC}$ and $V_{EE}$ is supplied to the bonding pad 31. The circuit 9 will operate in response to the voltage supplied to the bonding pad 31. However, the control circuit 2 is free from the above voltage, and accordingly, the control signal S2 therefrom is maintained at a low level, causing the transistors $Q_{11}$ and $Q_{12}$ and the transfer gate transistors 41 and 42 to be kept in the OFF state. The driver actuating signals S62 and S63 from the nodes N62 and N63 are free from the transistors $Q_{11}$ and $Q_{12}$. The resistor 10 is disconnected from the bonding pads 32 and 33, and thus the nodes N32 and N33 are not connected to the resistor 10. When a signal S60 in the normal circuit 6 is high level, on one hand, the driver actuating signal S62 is high level, and on the other hand, the driver actuating signal S63 is low level outputting a high level voltage from the output driver 71 to the bonding pad 32. Otherwise, a low level voltage is output from the output driver 71 to the bonding pad 32. The circuit 8 and the output driver 72 may also operate as described above.

In a test mode, a test request signal having a voltage higher than the threshold voltage $V_{th}$ of the transistor $Q_1$, which is sufficiently higher than the voltage of $V_{CC}$ as set forth above, is supplied to the bonding pad 31. The control circuit 2 outputs the high level control signal S2, causing the transistors $Q_{11}$, $Q_{12}$ and the transfer gate transistors 41 and 42 to be turned ON. The driver actuating signals S62 and S63 are compulsorily rendered to low level unless the level of the signal S60 is either low or high, whereby, the output driver 71 is also compulsorily made to have a high impedance. The output driver 72 is also compulsorily made to have a high impedance. Consequently, the resistor 10 connected to the bonding pads 32 and 33 at terminals thereof, through the transfer gate transistors 41 and 42, is not affected by the output drivers 71 and 72. In this condition, the test probes are in contact with the bonding pads 32 and 33, and measure a resistance of the resistor 10. This measurement may use the evaluation of the resistance characteristics of resistors formed in the MOS-IC chip and used for forming the normal circuits 6, 8, and 9.

In the above embodiment, no additional bonding pads are provided and the normal bonding pads 31 to 33 are commonly used for the normal operation mode and the test mode. This solves the problem of low integration due to the provision of additional bonding pads for the test means. Due to the provision of the output driver high-impedance making transistors $Q_{11}$ and $Q_{12}$ and the transfer gate transistors 41 and 42, the bonding pads 32 and 33 may be used selectively or exclusively for the normal operation mode and the test mode, without any adverse effects from the opposite mode. The test may be easily effected by handling the test probe on the bonding pads in a conventional manner. The test for the resistor 10 as one of the evaluating circuit elements may be achieved not only in the test steps from after formation of the bonding pads in each IC chip and before cutting the IC chips away from the wafer to before packaging the IC chips, by using the bonding pads, but also in the steps after packaging by using contact pins provided outside of the IC package and connected to the bonding pads in the IC package.

In the above embodiment, the transfer gate transistors may be provided in response to the number of evaluating circuit elements and up to the number of bonding pads. The high-impedance making transistors may be also provided in response to the number of the evaluating circuit elements and up to the number of output drivers.

Figure 2:
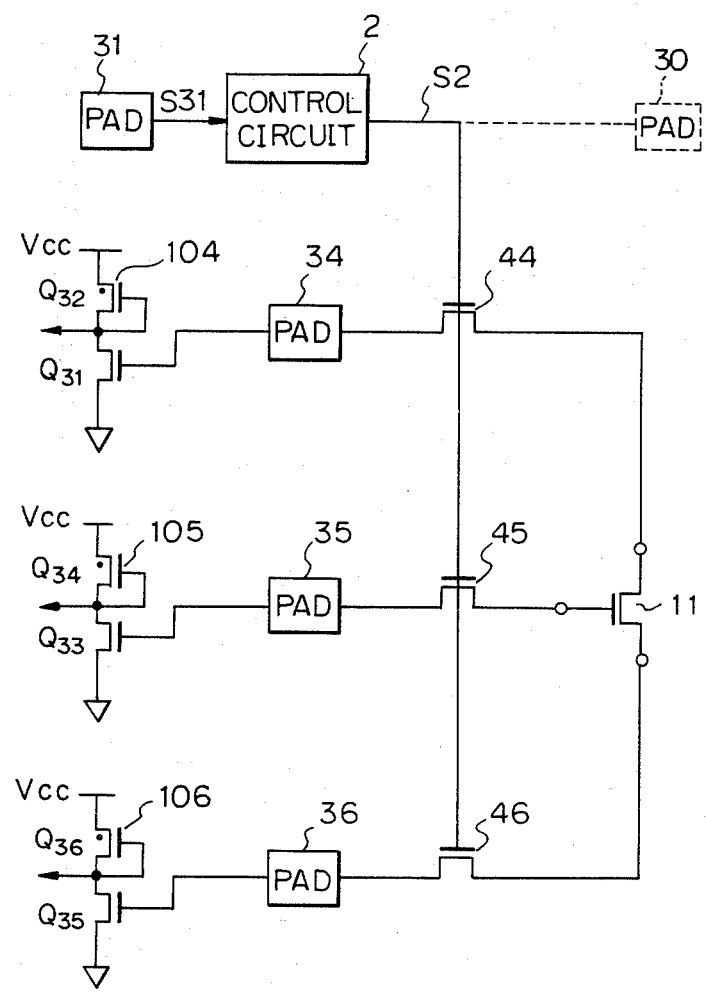
FIG. 2 is a circuit diagram of another embodiment of the semiconductor IC including another additional circuit element for evaluating the IC and means for testing the same, in accordance with the present invention.

Referring to FIG. 2, another MOS-IC chip including another evaluating circuit element and another test means is represented. In FIG. 2, the evaluating circuit element is a MOS transistor 11. The test means includes the control circuit 2 similar to that in FIG. 1, transfer gate transistors 44 to 46, and the bonding pad 31 as set forth above, and bonding pads 34 to 36. Inverters 104 to 106 consisting of a D-transistor $Q_{32}$ functioning as a resistor and an E-transistor $Q_{31}$, a D-transistor $Q_{34}$ and an E-transistor $Q_{33}$, and a D-transistor $Q_{36}$ and an E-transistor $Q_{35}$, respectively, function as input drivers of normal circuits. In this embodiment, the input drivers 104 to 106 have a sufficient high impedance to the bonding pads 34 to 36, and accordingly, input driver high-impedance making transistors corresponding to the output driver high-impedance making transistors $Q_{11}$ and $Q_{12}$ in FIG. 1 are not provided. This can be applied to the input driver in the circuit 9 in FIGS. 1 and 2 connected to the bonding pad 31.

In a normal operation mode, when the voltage between $V_{CC}$ and $V_{EE}$, set forth above, is supplied to the bonding pads 31 and 34 to 36, the control signal S2 from the control circuit 2 is low level, turning the transfer gate transistors 44 to 46 OFF, and accordingly, disconnecting the transistor 11 from the bonding pads 34 to 36. As a result, the circuit 9 and other normal circuits connected to the input drivers 104 to 106 may operate without effects from the transistor 11 and the test means except the bonding pads 31, and 34 to 36.

In a test mode, when the test request signal having the voltage higher than the threshold voltage $V_{th}$ of the transistor $Q_1$ in the control circuit 2 as shown in FIG. 1 is supplied to the bonding pad 31, the control circuit 2 outputs the control signal S2 having a high level, with the result that the transfer gate transistors 44 to 46 are turned ON, and thus, the transistor 11 is operatively-connected to the bonding pads 34 to 36. In this state, the test probes are in contact with the bonding pads 34 to 36, obtaining a variety of characteristics of the transistor 11. The transistor 11 may be regarded as a typical transistor of this type, and accordingly, the evaluation of this type of transistors in the IC chip may be effected through the obtained characteristics of the transistor 11. Since the input drivers 104 to 106 have a high-impedance to the bonding pads 34 to 36, the test is not adversely affected by the input drivers 104 to 106.

In the above embodiments of FIGS. 1 and 2, a variety of evaluating circuit elements, such as a capacitor and other type of transistors, as well as a variety of evaluating fundamental circuits, such as flip-flop and AND gates, may be formed in each IC chip. The test means may be applicable for testing the above evaluating circuit elements and/or the evaluating fundamental circuits. In the specification, the evaluating circuit element involves the evaluation of the fundamental circuit or the like.

In addition, in the above embodiments of FIGS. 1 and 2, the control circuit 2 is commonly connected to the bonding pad 31 with the circuit 9. In order to be free from the application of the normal voltage to the bonding pad 31, the control circuit 2 includes the transistor $Q_1$ having a higher threshold voltage $V_{th}$ than the high voltage of the normal voltage. However, when the control circuit 2 is supplied with a signal S31 requesting the test mode through a spare bonding pad which is not used for the normal circuit, it is not necessary to include the above special transistor $Q_1$ in the control circuit 2, which may include a normal E-transistor. The test request signal S31 to the control circuit 2 may be in the normal voltage range between $V_{CC}$ and $V_{EE}$.

Moreover, the control signal S2 may be directly supplied through a bonding pad 30 as shown by dotted lines in FIGS. 1 and 2. The control circuit 2 thus may be omitted.

Figure 3:
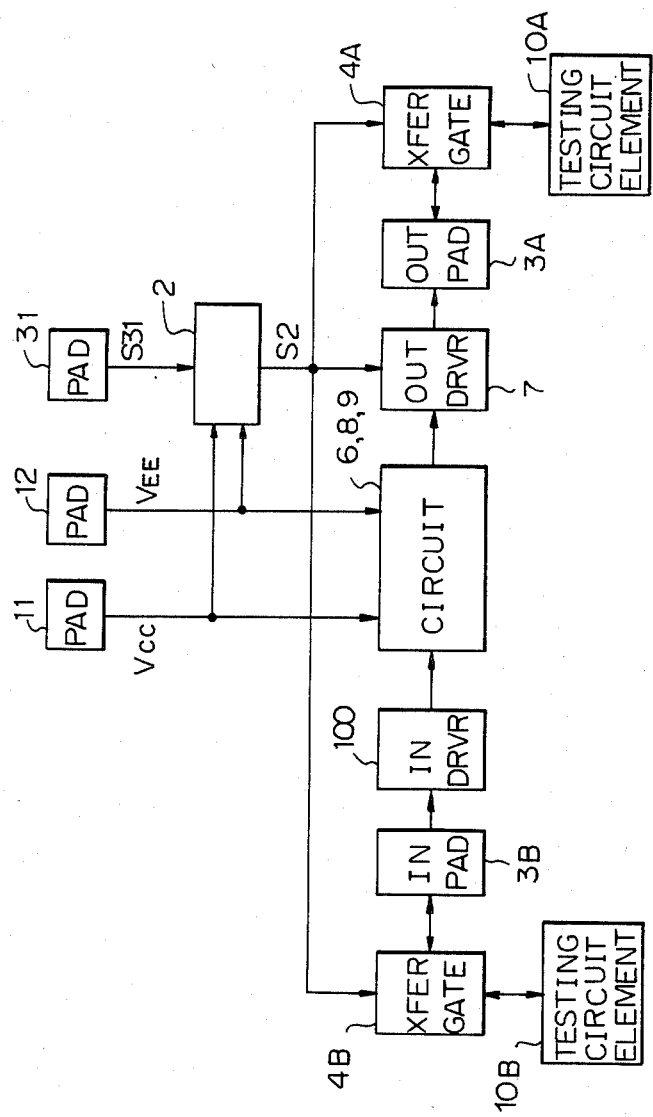
FIG. 3 is a block diagram of still another embodiment of the semiconductor IC combined with the contents shown in FIGS. 1 and 2, in accordance with the present invention.

Furthermore, the embodiments of FIGS. 1 and 2 may be combined. FIG. 3 represents a general block diagram of the combined MOS-IC of FIGS. 1 and 2 using the output bonding pads of FIG. 1 and the input bonding pads of FIG. 2. In FIG. 3, the MOS-IC includes a normal circuit portion containing the normal circuits 6, 8 and 9 in FIGS. 1 and 2, an output driver circuit 7 having the output drivers 71 and 72 in FIG. 1, an input driver circuit 100 having the input drivers 104 to 106 in FIG. 2, and bonding pads 11 and 12. The MOS-IC also includes testing circuit element portions 10A and 10B containing the evaluating resistor 10 in FIG. 1 and the evaluating transistor 11 in FIG. 2. In addition, the MOS-IC includes a test means consisting of the control circuit 2 as shown in FIG. 1, transfer gate transistor portions 4A and 4B containing the transistors 41 and 42 in FIG. 1, and the transistors 44 to 46. The bonding pad 31 may be commonly used for the normal circuit portion and the test means. An output bonding pad portion 3A containing the bonding pads 32 and 33 in FIG. 1 and the input bonding pad portion 3B containing the bonding pads 34 to 36 may be also commonly used for the normal circuit portion and the test means. The bonding pads 11 and 12 are used for supplying the power of $V_{CC}$ and $V_{EE}$ to the normal circuit, the control circuit 2, and other circuits in the MOS-IC.

In this embodiment, the evaluating circuit elements and the normal circuit may be tested not only between after formation of the bonding pads in the IC chips and before packaging of the IC chips, by using the bonding pads, but also after packaging the IC chips, by using pins of the IC device. The selection of either the test or normal operation mode is simply achieved by applying or not applying a predetermined voltage to the bonding pad 31.

The test of the evaluating circuit elements may be effected in a similar way to that of the normal circuit, and thus the evaluating circuit elements also may be automatically tested by using an automatic test facility in a same way as for an automatic test for the normal circuits well-known in the art.

Note that the area occupying the test means of the control circuit 2, the transfer gate circuits 4A and 4B, and connection lines therebetween is relatively small. In addition, the control circuit 2 may be omitted as described above. Accordingly, a low integration due to the provision of the test means may be minimized.

Figure 4:
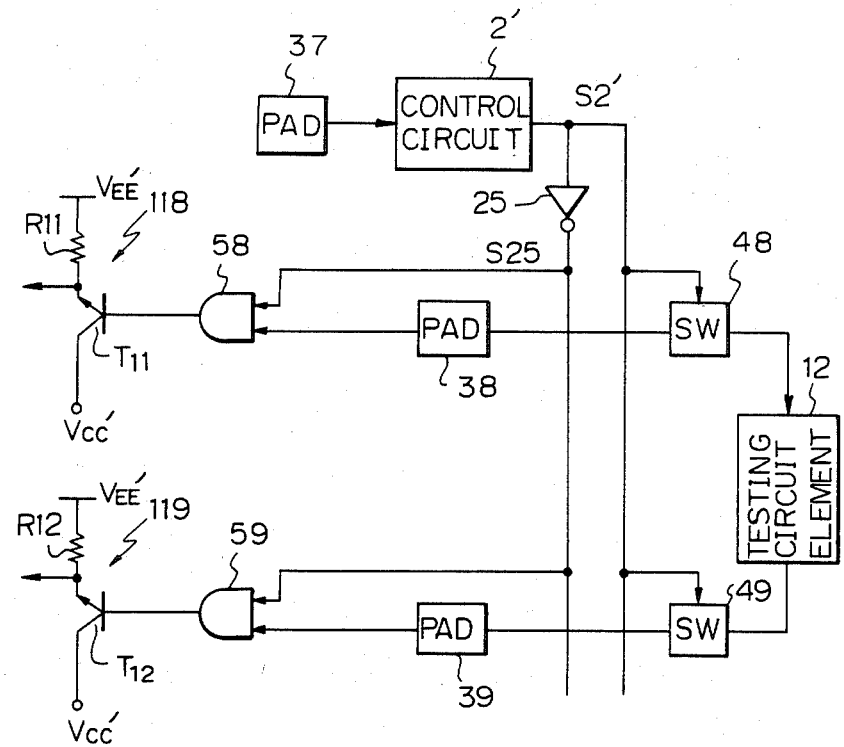
FIG. 4 is a circuit diagram of yet another embodiment of the semiconductor IC in accordance with the present invention.

In the above embodiments, the MOS-IC chip was described. Generally, the input drivers in the MOS-IC have a high-impedance, and accordingly, the input driver high-impedance making circuits are not required. If the input drivers have insufficient high-impedance, high-impedance making circuits should be provided even to the input drivers. FIG. 4 represents an embodiment of this case.

In FIG. 4, a bipolar IC chip includes an emitter-follower input driver 118 consisting of a seriesconnected resistor $R_{11}$ and transistor $T_{11}$, and an emitter-follower input driver 119 also consisting of a series-connected resistor $R_{12}$ and transistor $T_{12}$. The bipolar IC chip also includes a test circuit element 12, such as a resistor, and a test means. The test means includes a control circuit 2', an inverter 25, switching circuit 48 and 49, and AND gates 58 and 59. The control circuit 2' has a same function as that described above, but is formed by a bipolar technology. The switching circuits 48 and 49 may include bipolar transistors for transfer gates. Bonding pads 37 to 39 are similar to those in the above embodiments.

In a normal operation mode, a test request voltage is not applied to the bonding pad 37. The control circuit 2' outputs a control signal S2' having a low level. The switching circuits 48 are deenergized, breaking the connection between the test circuit element 12 and the bonding pads 38 and 39. The control signal S2' is converted to high level by the inverter 25, and a resultant signal S25 energizes terminals of the AND gates 58 and 59. If high level signals are supplied to the bonding pads 38 and 39, the input drivers 118 and 119 are operated.

In a test mode, the test request voltage is supplied to the bonding pad 37. The control circuit 2' outputs the control signal S2' having a high level. The AND gates 58 and 59 are brought to an inhibit state by applying the signal S25 having a low level. The switching circuits 48 and 49 are energized, connecting between the test circuit element 12 and the bonding pads 38 and 39. The characteristics of the test circuit element 12 may be obtained by placing the test probes in contact with the bonding pads.

A variety of the modifications discussed above can be applied to the embodiment in FIG. 4.

Many widely different embodiments of the present invention may be constructed without departing from the spirit and scope of the present invention. It should be understood that the present invention is not limited to the specific embodiments described in this specification, except as defined in the appended claims.

I claim:

1. A semiconductor integrated circuit comprising:
   at least one integrated circuit;
   at least one evaluating circuit element for evaluating said integrated circuit; and
   a testing means for testing said at least one integrated circuit by testing said at least one evaluating circuit element, said testing means including
   a plurality of bonding pads connected to said at least one integrated circuit and said at least one evaluating circuit element,
   selective means for selectively connecting between said at least one integrated circuit and said plurality of bonding pads during normal operation of said at least one integrated circuit, and said selective means for selectively connecting between at least one evaluating circuit element and said bonding pads connecting to said at least one integrated circuit during testing of said at least one evaluating circuit element, and
   switching means provided between said plurality of bonding pads and said at least one evaluating circuit element, said switching means for switching the connection between said plurality of bonding pads and said at least one evaluating circuit element in response to a control signal to enable said testing means to test said at least one evaluating circuit element.

2. A semiconductor integrated circuit according to claim 1 further comprising a high-impedance making means for controlling said at least one integrated circuit to have a high impedance as seen from said bonding pads in response to said control signal.

3. A semiconductor integrated circuit according to claim 2, wherein said integrated circuit comprises an output driver connected to said bonding pad,
   and wherein said high-impedance making means comprises a switching element deenergizing said output driver in response to said control signal.

4. A semiconductor integrated circuit according to claim 2, wherein said circuit comprises an input driver connected to said bonding pad and having a low impedance to said bonding pad,
   and wherein said high-impedance making means comprises a circuit (25, 58) electrically disconnecting a line from said input driver to said bonding pad in response to said control signal.

5. A semiconductor integrated circuit according to claim 1, wherein said selective means further comprises control signal outputting means for outputting said control signal in response to reception of a test request signal.

6. A semiconductor integrated circuit according to claim 5, wherein said control signal outputting means is connected to a bonding pad of said plurality of bonding pads to receive said test request signal.

7. A semiconductor integrated circuit according to claim 6, wherein said bonding pad connected to said control signal outputting means is connected to said circuit integrated,
   and integrated wherein said control signal outputting means comprises a transistor having a thresold voltage higher than a normal voltage supplied to said bonding pad for operating said circuit, said control signal outputting means being not operable to the application of said normal voltage to said bonding pad and being operable to the application of said test request signal having a voltage higher than said threshold voltage.

* * * * *